US006664469B1

(12) United States Patent
Sweeney

(10) Patent No.: US 6,664,469 B1
(45) Date of Patent: Dec. 16, 2003

(54) NEUTRAL BAR ASSEMBLY AND METHOD OF MAKING ASSEMBLY

(75) Inventor: Thomas M. Sweeney, Cincinnati, OH (US)

(73) Assignee: Ilsco Corporation, Cincinnati, OH (US)

(*) Notice: Subject to any disclaimer, the term of this patent is extended or adjusted under 35 U.S.C. 154(b) by 0 days.

(21) Appl. No.: 10/292,246

(22) Filed: Nov. 12, 2002

(51) Int. Cl.[7] .................................................. H05K 5/02

(52) U.S. Cl. ........................ 174/51; 174/40 CC; 174/6; 174/135; 439/507

(58) Field of Search ................................ 174/51, 35 C, 174/40 CC, 135, 6, 78, 35 R; 439/98, 92, 100, 798, 507, 511; 361/799, 753

(56) References Cited

U.S. PATENT DOCUMENTS

| | | | | |
|---|---|---|---|---|
| 3,594,710 A | * | 7/1971 | Stanback | 439/724 |
| 5,777,263 A | * | 7/1998 | Maehler et al. | 174/51 |
| 6,252,166 B1 | * | 6/2001 | Leschinger | 174/51 |

* cited by examiner

*Primary Examiner*—Dhiru R Patel
(74) *Attorney, Agent, or Firm*—Wood, Herron & Evans, LLP

(57) ABSTRACT

A neutral bar assembly is provided which includes a plurality of neutral bars electrically and structurally secured together with a pair of expanders. Each of the expanders is a unitary member made of an electrically conductive material, having a plurality of forwardly extending legs. Each of the legs fits into one of the bores of one of the neutral bars of the assembly and is secured therein with one of the wire-binding screws of one of the neutral bars.

24 Claims, 7 Drawing Sheets

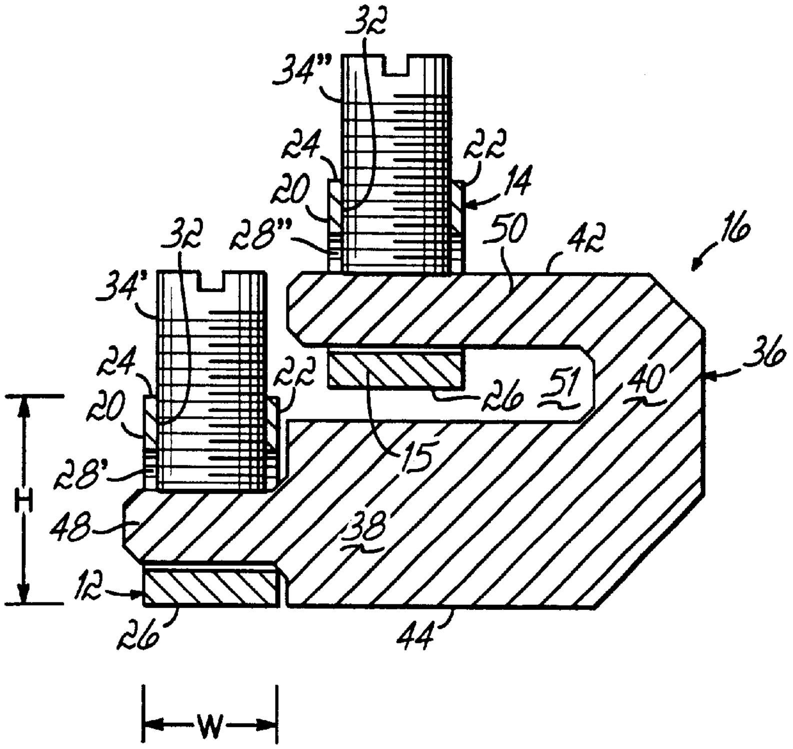
FIG. 2
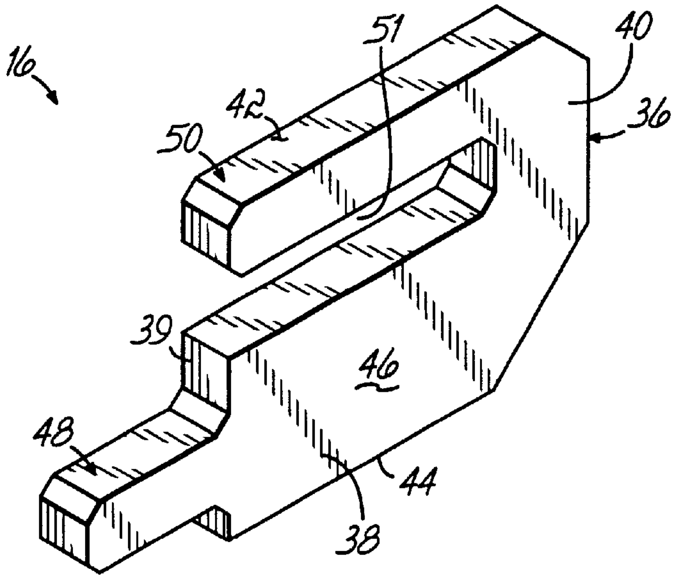

NEUTRAL BAR ASSEMBLY AND METHOD OF MAKING ASSEMBLY

FIELD OF THE INVENTION

This invention relates generally to neutral bar assemblies made up of several neutral bars electrically and mechanically coupled together and the method of making such neutral bar assemblies.

BACKGROUND OF THE INVENTION

Electrical enclosures, such as breaker boxes, commonly have only one neutral bar mounted therein for the purpose of referencing and/or grounding distribution circuits. In recent times, the use of electronic devices has expanded significantly, both commercially and in our homes. Consequently, the number of neutral or grounding outlets necessary to accommodate these additional electronic devices has increased. One solution to this problem is to expand or increase the size of the electrical enclosure to accommodate additional neutral bars. Customers such as home owners resist this solution because either: 1) it is too costly or 2) there is insufficient space for a larger electrical enclosure. Consequently, there is a need to add additional neutral or grounding outlets in an electrical enclosure of a fixed size.

Previous attempts to electrically couple multiple neutral bars together efficiently in a fixed space or volume have included mounting multiple neutral bars on a stepped bracket, such as is disclosed in U.S. Pat. No. 2,909,757. This method of mounting multiple neutral bars requires additional screws and mounting brackets and is therefore costly. In addition, the limited space within an electrical enclosure may not allow an electrician or an original equipment manufacture (OEM) to add additional neutral bars in this manner. Furthermore, the spacing between adjacent neutral bars in such an assembly may be insufficient so that an electrician may be unable to see into which hole he or she is inserting a wire.

Another drawback with existing neutral bar assemblies is that in order for the neutral bars to receive neutral conductors or wires of different diameters, additional equipment is required. U.S. Pat. No. 3,594,710 discloses such a neutral bar assembly which requires nuts and bolts to secure neutral bars having different hole spacings and different wire range holes together in an assembly. Again, this method of mounting neutral bars together is costly because of the additional equipment required.

The most common current method of securing additional neutral bars to a mounted neutral bar in an electrical enclosure is to independently mount each additional neutral bar in the electrical enclosure and connect the bars with a single wire. This method is costly and provides only a single electrical connection between the neutral bars.

Another less common method of electrically joining neutral bars in an electrical enclosure has been to bend a copper wire into a Z shape and secure the ends of the copper wire in wire-receiving holes of the neutral bars with wire binding screws. However, this method does not allow the neutral bars to be placed close enough together to maximize the space inside the electrical enclosure. In addition, this method is not practical because the neutral bars are not rigidly mounted together. Therefore, when an electrician tightens a wire binding screw to secure a wire into one of the openings in one of the neutral bars, the z-shaped copper wire may bend or deflect, jeopardizing the electrical connection between the neutral bars.

Consequently, there is a need to electrically and structurally connect several neutral bars together in a compact, efficient, and cost-effective manner, without increasing the size of the electrical enclosure. There is also a need for a method of connecting adjacent neutral bars structurally and electrically such that the wire-binding screws may be torqued properly without disturbing the electrical connection and spacing between the neutral bars. Further, there is a need for a neutral bar assembly through which an electrician may see to put the correct wire in the correct hole or bore. There is also a need for a method of structurally and electrically joining adjacent neutral bars having different hole spacings and different wire range holes. Finally, there is a need for a relatively inexpensive and convenient method to use expanders for structurally and electrically interconnecting two or more neutral bars together to form a spatially compact multi-bar assembly.

SUMMARY OF INVENTION

The present invention overcomes the foregoing and other shortcomings and drawbacks of neutral bar expanders and assemblies heretofore known. While the invention will be described in connection with certain embodiments, it will be understood that the invention is not limited to these embodiments. On the contrary, the invention includes all alternatives, modifications, and equivalents as may be included within the spirit and scope of the present invention.

The present invention comprises a neutral bar assembly in which at least two neutral bars are electrically and mechanically secured together with a pair of expanders to form a spatially compact multi-bar assembly. In one preferred embodiment of the present invention, first and second neutral bars are coupled together with a pair of generally U-shaped expanders, each having spaced-apart, generally parallel legs which are received in respective wire-receiving bores of the two neutral bars being assembled to each other. In an alternative preferred embodiment of the present invention, three neutral bars are electrically and mechanically joined together with a pair of expanders, which are each generally shaped like a staircase, each having three spaced-apart, generally parallel legs which are received in respective wire-receiving bores of the neutral bars being assembled to each other. Although the expanders of the present invention preferably secure together two or three neutral bars, any number of neutral bars may be joined together in accordance with the present invention.

In each of the preferred embodiments of the present invention, the neutral bars are preferably die cast of aluminum, as is conventional; however, the neutral bars may be made of any electrically conductive material and stamped or extruded. Each of the neutral bars is generally elongated in overall shape with a rectangular transverse cross-section, having generally planar, parallel front and rear surfaces, generally planar, parallel top and bottom surfaces, and generally planar, parallel end surfaces.

A plurality of spaced bores extend through the neutral bar from the front surface to the rear surface. These bores are typically not threaded, although they may be threaded. The bores are sized and adapted to receive grounding wires from the rear thereof, as is conventional. The bores within each of the neutral bars are typically the same diameter and have a defined pitch, i.e. the distance between the centers of adjacent bores. The neutral bars are generally less than a foot long, however, may be three or four feet long depending upon the size of the breaker box or electrical enclosure which contains them. One common size bore for a neutral bar is approximately a quarter inch in diameter, accommodating wire gauges from 14 to 4, increasing in wire diameter. In addition, the bores may be of a larger diameter as to accommodate larger gauge wires, e.g. 2 to 0 gauge wires. One of the advantages of the present invention is that neutral bars made from different manufacturers, having different pitches may be joined together. In addition, neutral bars having different lengths and bores of different diameters may be joined together in accordance with the present invention.

In order to secure the wires inside the bores, a plurality of spaced, threaded holes extend downwardly from the top surface of the neutral bar into the bores of the neutral bar. A plurality of wire-binding screws are engaged in the threaded holes and when rotated advance into the bores of the neutral bar, thereby trapping or securing the grounding wires between the bores and the bottoms of the wire-binding screws.

Each of the expanders of the present invention is a unitary member made from an electrically conductive material. The expanders are preferably made of aluminum, but may be made of bronze, copper, or any other conductive material. Each of the expanders is preferably cast from aluminum, but may be manufactured via other methods, such as welding multiple pieces together. In addition, the expanders may be made by extruding a length of electrically conductive material such as aluminum in the desired shape and then cutting that extruded length in a transverse direction so that each expander has a desired width.

Each of the expanders has a body portion and at least two legs extending forwardly from the body portion. In one preferred embodiment of the present invention, each expander is generally U-shaped, having two spaced, parallel legs extending forwardly from a body portion. In another preferred embodiment of the present invention used to connect three or more neutral bars, each of the expanders is generally staircase-shaped, having three spaced, parallel legs extending forwardly from a body portion. In accordance with the present invention, the expanders may assume other configurations and shapes, as will be described in more detail below.

In each of the embodiments of the present invention, the legs of the expanders are inserted into the bores of the neutral bars and the wire-binding screws tightened in order to secure the legs of the expanders in the bores of the neutral bars. No additional brackets, bolts or hardware is necessary to secure the expanders to the neutral bars.

One method of making the neutral bar assembly of the present invention comprises adding at least one neutral bar to a neutral bar already mounted in an electrical enclosure. In this method, one of the legs of each of the expanders is inserted into one of the bores of each neutral bar to be added. Then the remaining legs of each of the expanders are inserted into the bores of the already mounted neutral bar and secured therein by tightening the appropriate wire-binding screws. Another method of making the neutral bar assembly of the present invention is the join all the neutral bars together into an assembly before the assembly is mounted in the electrical enclosure.

These and other objects and advantages of the present invention will be more readily apparent from the following drawings.

BRIEF DESCRIPTION OF THE DRAWINGS

The accompanying drawings, which are incorporated in and constitute part of this specification, illustrate embodiments of the invention and, together with the general description of the invention given above, and the detailed description of the embodiments given below, serve to explain the principles of the invention.

FIG. 2 is a cross-sectional view taken along the line 2—2 of FIG. 1;

FIG. 3 is a perspective view of one preferred embodiment of the expander used in the neutral bar assembly of FIG. 1;

DETAILED DESCRIPTION OF PREFERRED EMBODIMENTS

Figure 1:
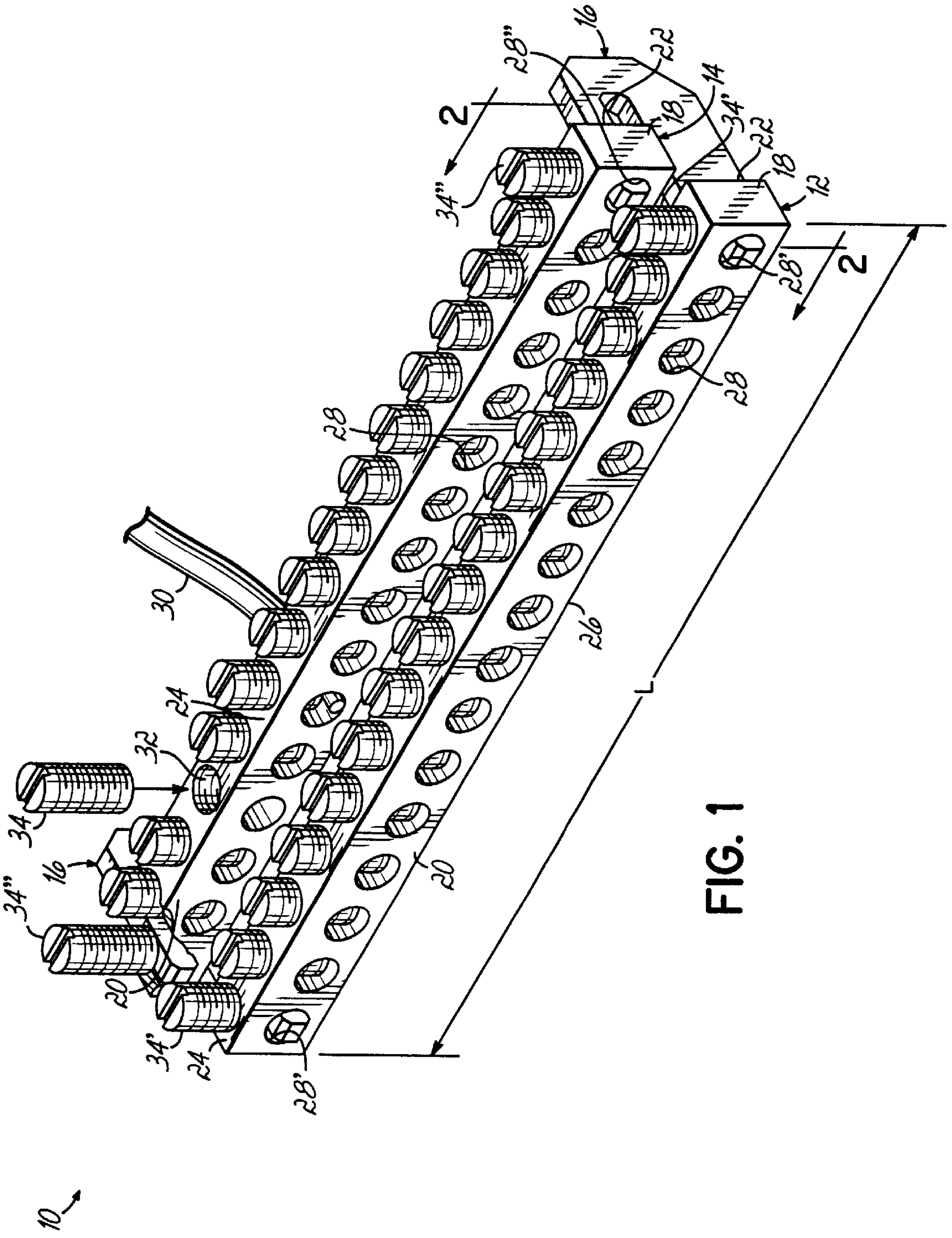
FIG. 1 is a perspective view of a neutral bar assembly, comprising first and second identical neutral bars secured together with a first embodiment of expander.

Referring to the drawings, and particularly to FIGS. 1–3, there is illustrated a neutral bar assembly 10 comprising a first neutral bar 12 and a second neutral bar 14 secured together with a pair of expanders 16. Each of the expanders 16 is illustrated in more detail in FIGS. 2 and 3 and will be described in more detail below. Due to the configuration of the expanders 16, the second neutral bar 14 is positioned and secured generally above and behind the first neutral bar 12. The neutral bars 12, 14 are positioned relative to each other such that an electrician may see therebetween in order to see which wire is going in which hole.

Each of the neutral bars 12, 14 has a pair of opposed end surfaces 18 (only one being show) which define a length L of the neutral bar. Each of the neutral bars 12, 14 also has a generally planar front surface 20 and a parallel, generally planar rear or back surface 22 which define the width W of the neutral bar. Lastly, each of the neutral bars 12, 14 has a top surface 24 and a bottom surface 26, which define the height H of the neutral bar. See FIG. 2.

Figure 7:
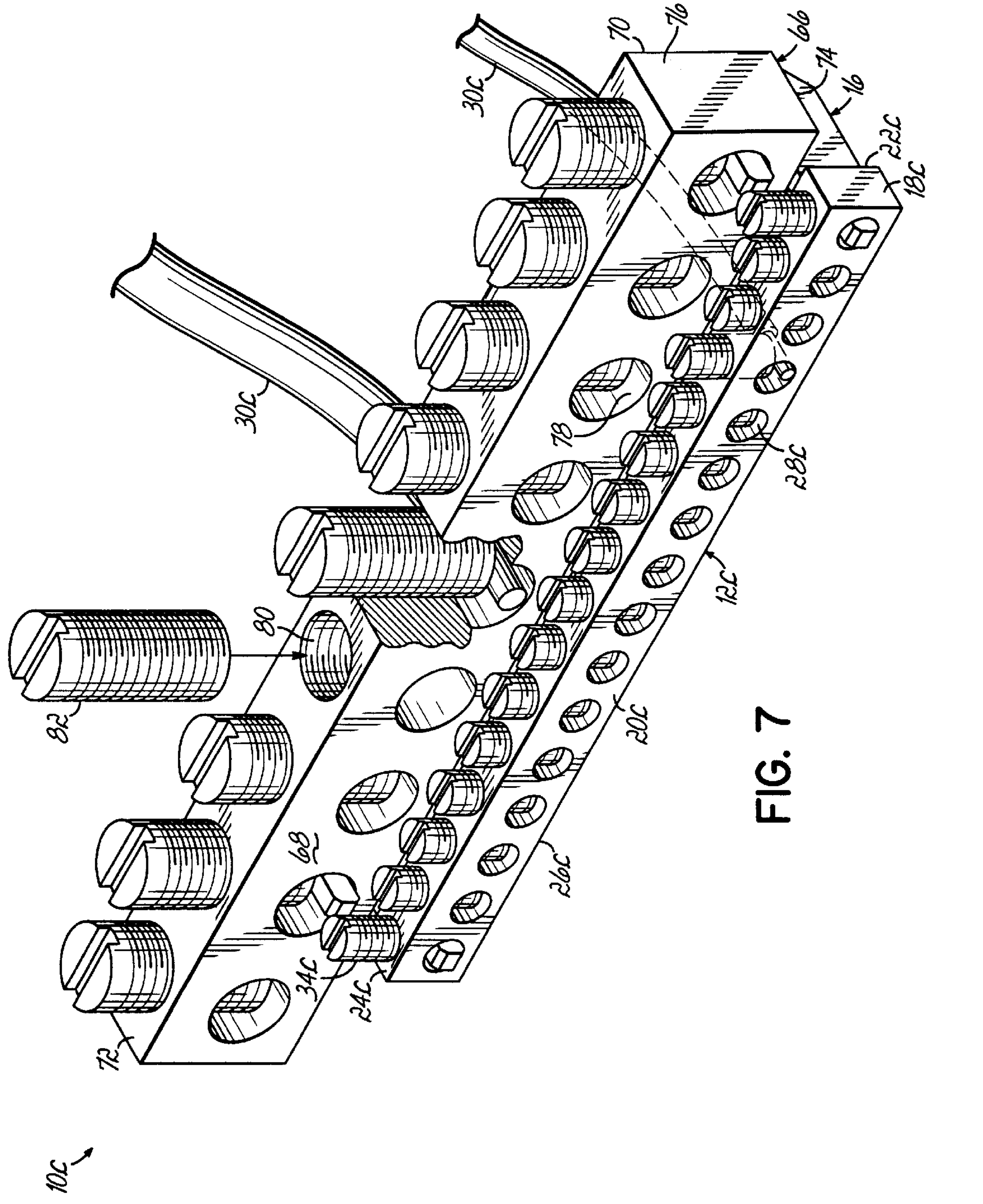
FIG. 7 is a perspective view of an alternative embodiment of neutral bar assembly incorporating different neutral bars designed to connect different gauge wires in accordance with the present invention.

Although the first and second neutral bars 12, 14 are illustrated in FIG. 1 as having an identical height, width, and length, they may have different lengths, widths, or heights from each other in accordance with the present invention. This feature of the present invention will be described in more detail below and is shown in FIG. 7.

As is conventional, each of the neutral bars 12, 14 has a plurality of spaced bores 28 extending through the neutral bar from the front surface 20 to the rear surface 22. Each of these bores 28 is generally circular in nature, although the bores may assume other configurations in accordance with the present invention. Within a neutral bar, each of the bores 28 is typically the same diameter; however, the diameters may vary within a neutral bar. Wires 30 (only one being shown) pass through the rear surface 22 of the neutral bar into the bores 28 of the neutral bar. Thus, each neutral bar may hold as many wires as there are bores within the neutral bar, minus the two bores in which a portion of each expander 16 is located.

In addition, each of the neutral bars 12, 14 has a plurality of spaced, threaded holes 32 extending downwardly from the top surface 24 of the neutral bar into one of the bores 28. Each of the threaded holes 32 has a wire-binding screw 34 threadedly engaged therein. Although one configuration of wire-binding screw is illustrated, the wire-binding screw may assume other configurations in accordance with the present invention.

As best illustrated in FIG. 3, each of the expanders 16 in accordance with this embodiment of the present invention is a unitary member preferably cast from aluminum, having a generally L-shaped body portion 36 including a first portion 38 and a second portion 40. The second portion 40 extends upwardly from the rear of the first portion 38 in a substantially L-shape. The first portion 38 of the body portion 36 has a front surface or shoulder 39 which functions to provide a stop preventing the first neutral bar 12 from moving rearwardly.

The expander 16 has a generally planar top surface 42, a generally planar bottom surface 44, and a pair of generally planar side surfaces 46, which define the width of the expander 16. Extending forwardly from the first portion 38 of the body portion 36 is a first leg 48 and extending forwardly from the second portion 40 of the body portion 36 is a second leg 50. The first leg 48 is located in front of the second leg 50 and below the second leg 50. Between the second leg. 50 and the first portion 38 of the body portion 36 is a slot 51 in which a lower portion 15 of the second neutral bar 14 is located, as shown in FIG. 2. In this embodiment of the present invention, the expander 16 is of a uniform width and each of the first and second legs 48, 50 has a generally rectangular cross-sectional configuration, as best shown in FIG. 3.

The configuration of the expanders 16 functions to position the neutral bars 12, 14 relative to each other such that an electrician may see therebetween in order to see which wire is going in which hole. More particularly, the front surface 39 abuts the rear surface 22 of the first neutral bar 12, thereby preventing the first neutral bar from moving rearwardly and ensuring adequate spacing between the first and second neutral bars 12, 14.

As best illustrated in FIG. 2, the first or lower leg 48 of the expander 16 is received in the outermost bore 28' of the first neutral bar 12 and secured therein with one of the wire-binding screws 34'. In addition, the second leg 50 of the expander 16 is located in the outermost hole 28" of the second neutral bar 14 and secured therein with wire-binding screw 34".

Although the legs 48, 50 of each of the expanders 16 are illustrated as being secured in the outermost bores 28', 28" of the first and second neutral bars 12, 14, respectively; they may be located in any of the bores of the first and second neutral bars 12, 14 without departing from the spirit or scope of the present invention. Although two expanders 16 are illustrated and described, the neutral bars 12, 14 may be secured together with more than two expanders 16.

Figure 4:
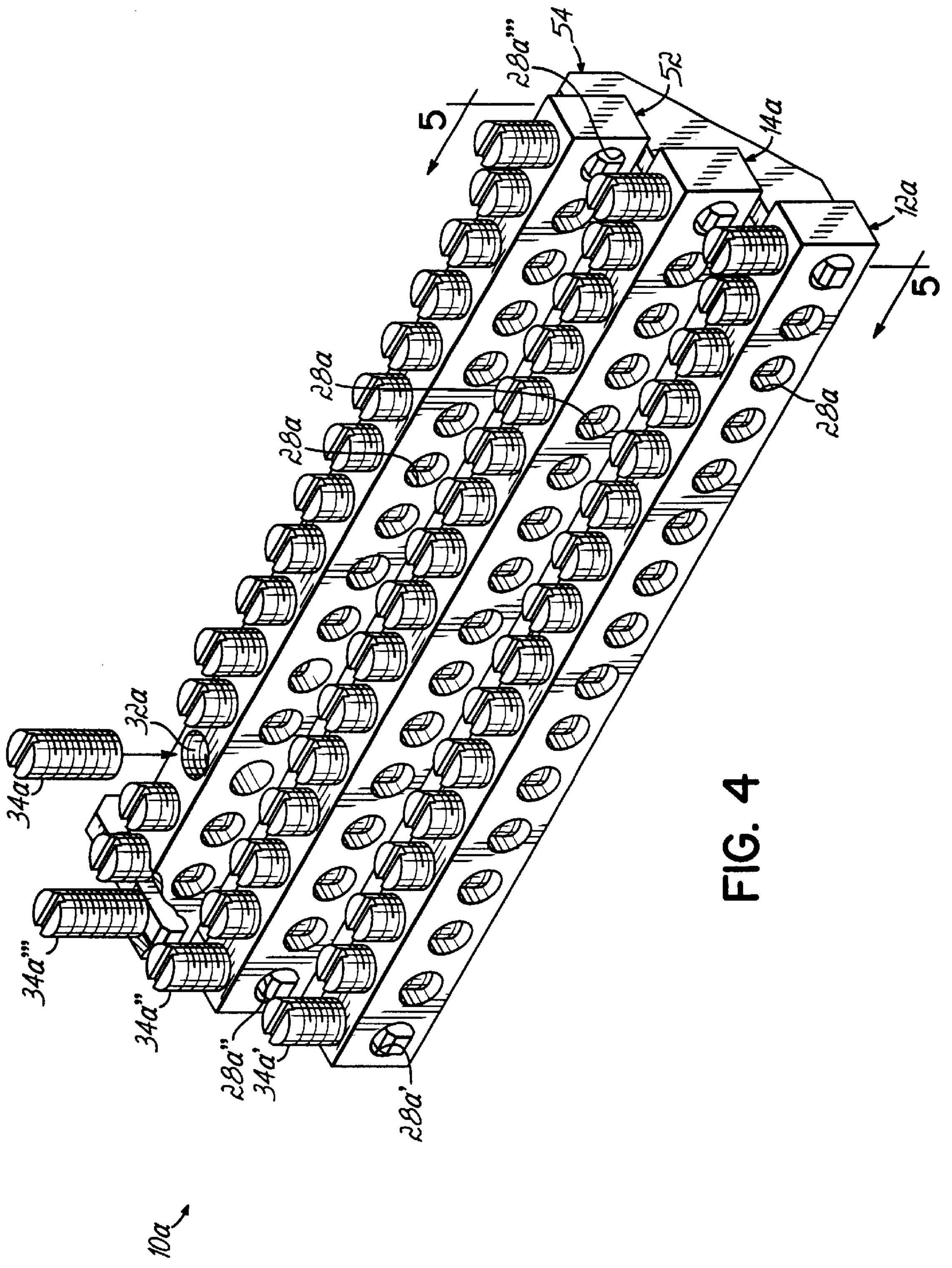
FIG. 4 is an alternative preferred embodiment of a neutral bar assembly having three identical neutral bars in accordance with the present invention.
Figure 5:
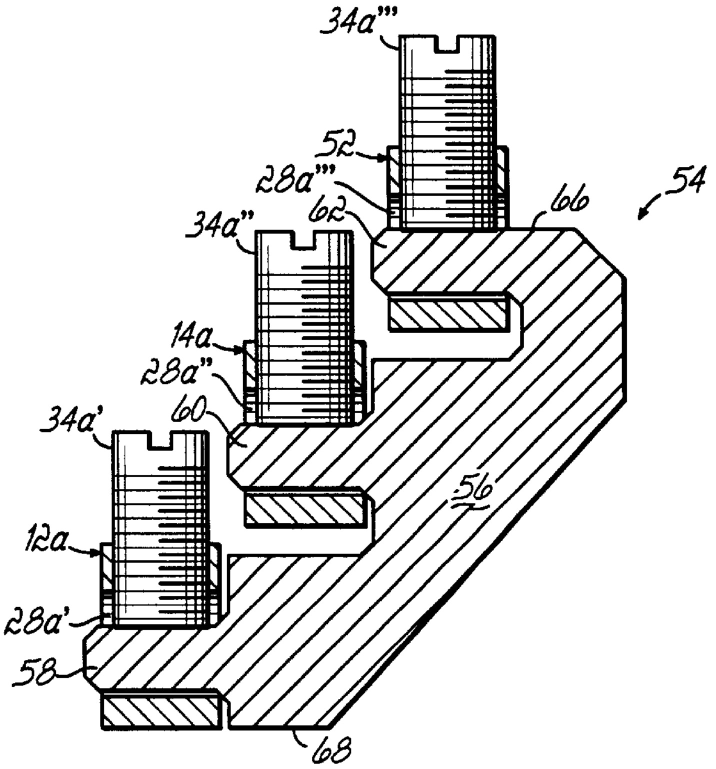
FIG. 5 is a cross-sectional view taken along the line 5—5 of FIG. 4.
Figure 6:
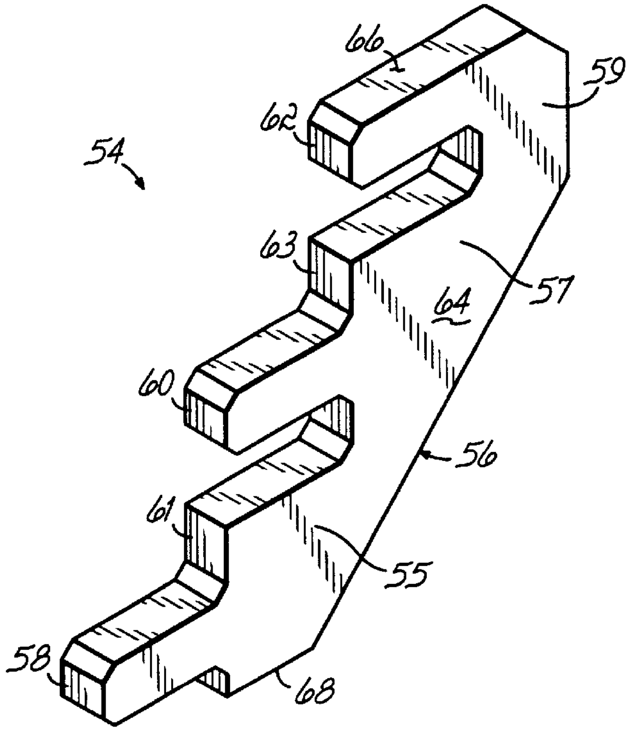
FIG. 6 is a perspective view of a second preferred embodiment of expander used in the embodiment of FIGS. 4 and 5.

FIGS. 4–6 illustrate an alternative preferred embodiment of the present invention. In this embodiment of the present invention, a neutral bar assembly **10*a* is illustrated comprising a first neutral bar 12*a*, a second neutral bar 14*a*, located generally above and behind the first neutral bar 12*a*, and a third neutral bar 52 located generally above and behind the second neutral bar 14*a***. Each of the first, second, and third neutral bars is identically configured, having the same length, width, and height. However, neutral bars of different lengths may be used in accordance with the this embodiment of the present invention.

Each of the three neutral bars **12*a*, 14*a* and 52 are identically configured, each having a plurality of bores 28*a*, a plurality of threaded holes 32*a* and a plurality of wire binding screws 34*a*. The neutral bars 12*a*, 14*a* and 52 are identically configured to the first and second neutral bars 12, 14** described hereinabove.

Referring to FIGS. 5 and 6, the first, second and third neutral bars **12*a*, 14*a* and 52 are electrically and mechanically joined by a pair of expanders 54. Each of the expanders 54 is generally staircase shaped having a body portion 56 including a first step portion 55 having a front surface 61, a second step portion 57 having a front surface 63 and a top portion 59. A first leg 58 extends forwardly from the first step portion 55, a second leg 60 located above said first leg 58 extends forwardly from the second step portion 57 and a third leg 62 located above said second leg 60 extends forwardly from the top portion 59. Thus, each of the legs 58, 60 and 62 extend generally forwardly from the body portion 56. Each expander 54 has a pair of opposed side surfaces 64 defining the width of the expander 54, a generally planar upper surface 66 and a generally planar lower surface 68. Each leg 58, 60 and 62** has a generally rectangular cross-sectional configuration.

The configuration of the expanders 54 functions to position the three neutral bars **12*a*, 14*a* and 52 relative to each other such that an electrician may see therebetween in order to see which wire is going in which hole. More particularly, as best illustrated in FIG. 5, the front surface 61 of the first step portion 55 abuts the rear surface 22*a* of the first neutral bar 12*a*, thereby preventing the first neutral bar 12*a* from moving rearwardly and ensuring adequate spacing between the first and second neutral bars 12*a*, 14*a*. Similarly, the front surface 63 of the second step portion 57 abuts the rear surface 22*a* of the second neutral bar 14*a*, thereby preventing the second neutral bar 14*a* from moving rearwardly and ensuring adequate spacing between the secondhand third neutral bars 14*a*, 52**.

Like the expanders 16 of the embodiment described hereinabove, each of the expanders 54 is a unitary member, preferably cast from aluminum, although the expanders could be stamped from sheet material having a thickness equal to the width of the expander, or extruded from bar stock and cut-off in increments of a desired width. However, the expanders 54 may be made of any electrically conductive material.

Referring to FIG. 5, the first leg 58 of the expander 54 is located inside the outermost bore **28*a*' of the first neutral bar 12*a* and secured therein with wire binding screw 34*a*'. Similarly, the second leg 60 of the expander 54 is located inside the outermost bore 28*a*" of the second neutral bar 14*a* and secured therein with wire binding screw 34*a*". Additionally, the third leg 62 of the expander 54 is located inside the outermost bore 28*a*'" of the third neutral bar 52 and secured therein with wire binding screw 34*a*'"**.

FIG. 7 illustrates yet another preferred embodiment of the present invention. In this embodiment, a neutral bar assembly 10*c* is created from neutral bars of different sizes and lengths. The neutral bar assembly 10*c* comprises a first neutral bar 12*c* similar to the neutral bars 12 and 12*a* described hereinabove, a second neutral bar 66 and a pair of expanders 16 identical to those shown in FIG. 3 and described hereinabove. The length of neutral bar 66 exceeds that of neutral bar 12*c*. The first neutral bar 12*c* has generally planar front and rear surfaces 20*c*, 22*c*, generally planar top and bottom surfaces 24*c*, 26*c* along with end surfaces 18*c*. The second neutral bar 66 has generally planar front and rear surfaces 68, 70, generally planar top and bottom surfaces 72, 74 along with end surfaces 76. Due to the difference in size each of the surfaces of the second neutral bar 66 is larger than the corresponding surface of the first neutral bar 12*c*.

The second neutral bar 66 has a plurality of bores 78 of a diameter greater than the diameter of the bores 28*c* of the first neutral bar 12*c* which are adapted to receive wires 30*c*. In addition, the second neutral bar 66 has a plurality of threaded holes 80 of a diameter greater than the diameter of the threaded holes 32 of the first neutral bar 12*c* and a plurality of wire binding screws 82 which are larger than the wire binding screws 34*c* of the first neutral bar 12*c*.

The configuration of the expanders 16 allows neutral bars of different lengths and transverse cross-sectional sizes such as neutral bars 66 and 12*c* to be electrically and mechanically connected.

Figure 8:
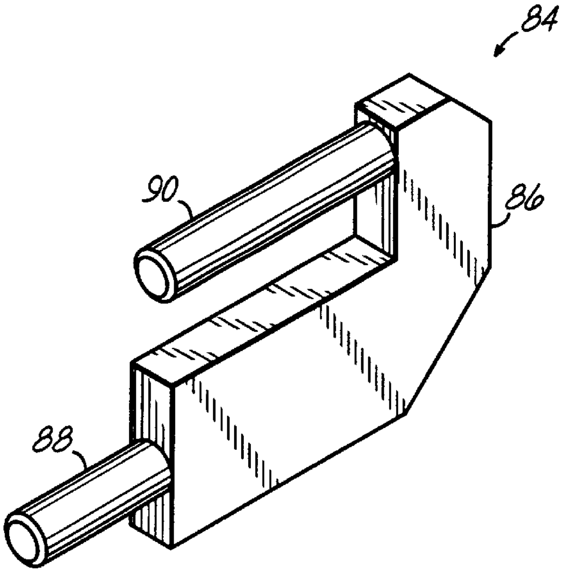
FIG. 8 is a perspective view of an alternative embodiment of expander.

FIG. 8 illustrates an alternative embodiment of expander 84 having a body portion 86, a first leg 88 and a second leg 90 located above the first leg 88. Each of the legs 88, 90 has a circular cross-sectional configuration.

Figure 9:
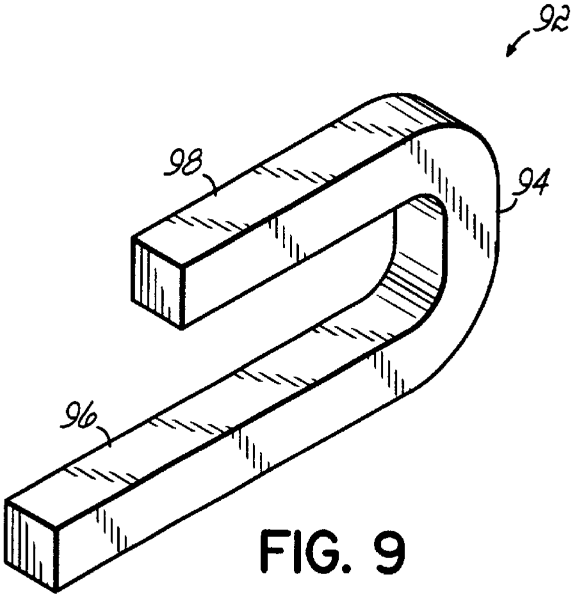
FIG. 9 is a perspective view of a still further preferred embodiment of expander.
Figure 10:
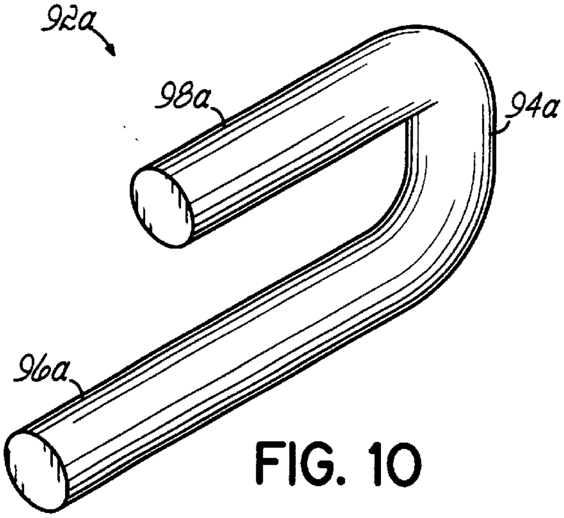
FIG. 10 is a perspective view of yet another preferred embodiment of expander.

FIGS. 9 and 10 illustrate additional alternative embodiments of expanders. FIG. 9 illustrates a generally U-shaped expander 92 having a curved body portion 94, a first leg 96 and a second leg 98 located above the first leg 96. First leg 96 is longer than second leg 98. Each of the legs 96, 98 along with the body portion 94 has a square cross-sectional configuration.

FIG. 10 illustrates a generally U-shaped expander 92*a* having a curved body portion 94*a*, a first leg 96*a* and a second leg 98*a* located above the first leg 96*a*. First leg 96*a* is longer than second leg 98*a*. Each of the legs 96*a*, 98*a* along with the body portion 94*a* has a circular cross-sectional configuration.

Figure 11:
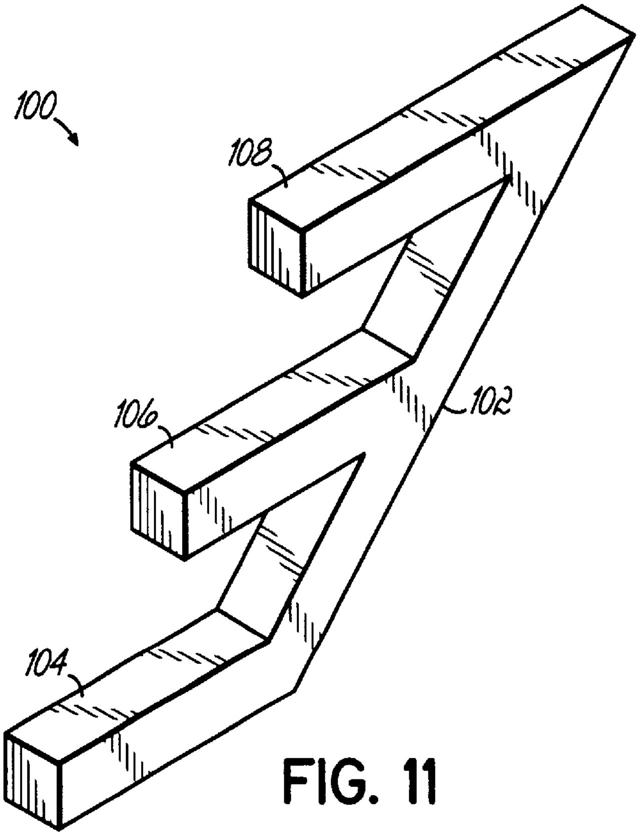
FIG. 11 is a perspective view of another preferred embodiment of expander.
Figure 12:
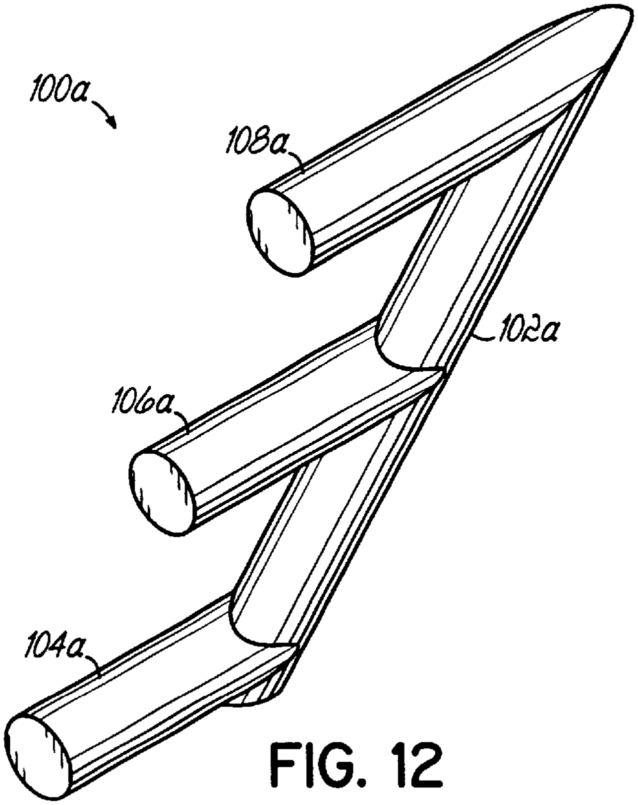
FIG. 12 is a perspective view of still another preferred embodiment of expander.

FIGS. 11 and 12 illustrate additional alternative embodiments of expanders which may be used in accordance with the present invention. FIG. 11 illustrates an expander 100 having a straight body portion 102, a first leg 104, a second leg 106 located above the first leg 104 and a third leg 108 located above the second leg 106. Each of the legs 104, 106, 108 extend forwardly from the body portion 102. Each of the legs 104, 106, 108 along with the body portion 102 have a square cross-sectional configuration. The legs 104, 106, 108 are preferably welded to the body portion 102 but may be secured via other means.

FIG. 12 illustrates an expander 100*a* having a straight body portion 102*a*, a first leg 104*a*, a second leg 106*a* located above the first leg 104*a* and a third leg 108*a* located above the second leg 106*a*. Each of the legs 104*a*, 106*a*, 108*a* extend forwardly from the body portion 102*a*. Each of the legs 104*a*, 106*a*, 108*a* along with the body portion 102*a* have a circular cross-sectional configuration. The legs 104, 106, 108 are preferably welded to the body portion 102 but may be secured via other means.

One method of making the expanders of the present invention and particularly those embodiments shown in FIGS. 3, 6, 9 and 11, is to extrude a length of electrically conductive material from bar stock through an extruder, as is conventional. Once the length of electrically conductive material has been extruded such that the result has the desired shape, the length is cut in a transverse direction such that the resultant expanders have a desired width.

Regarding the embodiments of expander shown in FIGS. 3, 6, 9 and 11, the legs of each of these expanders have a rectangular cross sectional configuration. Hence, the screws of the neutral bars engage a flat surface of the expander, typically the top surface of the expander legs. Hence, the configuration of the legs of the expander are helpful in preventing the neutral bars from moving relative to each other in a direction parallel to their respective lengths.

While the present invention has been illustrated by a description of various embodiments and while these embodiments have been described in considerable detail, it is not the intention of applicant to restrict or in any way limit the scope of the appended claims to such detail. Additional advantages and modifications will readily appear to those skilled in the art. The invention in its broader aspects is therefore not limited to the specific details, representative apparatus and method, and illustrative examples shown and described. Accordingly, departures may be made from such details without departing from the spirit or scope of applicant's general inventive concept.

Having described the invention, what is claimed is:

1. A neutral bar assembly comprising:

a first neutral bar;

a second neutral bar;

each of said first and second neutral bars having a plurality of spaced bores extending through the neutral bar and a plurality of spaced, threaded holes, said bores being adapted to receive wires from behind the neutral bar, each of said holes extending downwardly into one of said bores;

a plurality of wire binding screws threadably engaged in said holes; and a pair of expanders, each of said expanders being a unitary member made from an electrically conductive material and having a body portion, a first leg extending forwardly from said body portion and a second leg extending forwardly from said body portion, said first and second legs being spaced apart and generally parallel to each other, said first leg of said expander being secured in one of said bores of said first neutral bar by one of said wire binding screws and said second leg of said expander being secured in one of said bores of said second neutral bar by one of said wire binding screws.

2. The neutral bar assembly of claim 1 wherein said first and second neutral bars are identical.

3. The neutral bar assembly of claim 1 wherein said first and second neutral bars are of different lengths.

4. The neutral bar assembly of claim 1 wherein said bores of said first neutral bar are of a different diameter than the bores of said second neutral bar.

5. The neutral bar assembly of claim 1 wherein each of said expanders is stamped from a piece of metal.

6. The neutral bar assembly of claim 1 wherein each of said expanders is made of aluminum.

7. The neutral bar assembly of claim 1 wherein each of said legs of said expander has a rectangular cross-sectional configuration.

8. The neutral bar assembly of claim 1 wherein each of said legs of said expander has a circular cross-sectional configuration.

9. The neutral bar assembly of claim 1 wherein each of said expanders is cast.

10. The neutral bar assembly of claim 1 wherein said second neutral bar is positioned generally above and behind said first neutral bar.

11. A neutral bar assembly comprising:

a first neutral bar;

a second neutral bar positioned generally above and behind said first neutral bar;

a third neutral bar positioned generally above and behind said second neutral bar;

each of said neutral bars having a plurality of spaced bores extending through the neutral bar and a plurality of spaced, threaded holes, each of said bores being adapted to receive a wire from behind the neutral bar and each of said holes extending downwardly into one of said bores;

a plurality of wire binding screws threadably engaged in said holes; and a pair of expanders fixing the position of said neutral bars relative to each other, each of said expanders being a unitary member made from an electrically conductive material and having a body portion and a plurality of spaced-apart, generally parallel legs extending forwardly from said body portion, each of said legs being secured in one of said bores of one of said neutral bars by one of said wire binding screws.

12. The neutral bar assembly of claim 11 wherein each of said neutral bars are identical.

13. The neutral bar assembly of claim 11 wherein at least two of said neutral bars are different.

14. The neutral bar assembly of claim 11 wherein said bores of one of said neutral bars are of a different diameter than the bores of another of said neutral bars.

15. The neutral bar assembly of claim 11 wherein each of said expanders is stamped from a piece of aluminum.

16. The neutral bar assembly of claim 11 wherein each of said legs of said expander has a rectangular cross-sectional configuration.

17. The neutral bar assembly of claim 11 wherein each of said legs of said expander has a circular cross-sectional configuration.

18. The neutral bar assembly of claim 11 wherein each of said expanders is cast.

19. A neutral bar assembly comprising:

a plurality of neutral bars, each of said neutral bars having a plurality of spaced bores extending through the neutral bar, each of said bores being adapted to receive a wire from behind the neutral bar;

each of said neutral bars having a plurality of spaced, threaded holes, each of said holes extending downwardly from a top surface of said neutral bar into one of said bores;

a plurality of wire binding screws threadably engaged in said holes; and a plurality of expanders extending between said neutral bars and fixing the position of said neutral bars relative to each other, each of said expanders being a unitary member made from an electrically conductive material and having a body portion and a plurality of spaced, apart, generally parallel legs extending forwardly from said body portion, each of said legs being secured in one of said bores of one of said neutral bars by one of said wire binding screws.

20. A neutral bar assembly comprising:

a first neutral bar;

a second neutral bar;

each of said first and second neutral bars having a plurality of spaced bores extending through the neutral bar from front to back;

a plurality of spaced, threaded holes, each of said holes extending downwardly from a top surface of the neutral bar into one of said bores;

wire binding screws threadably engaged in said holes; and a pair of generally U-shaped expanders, each of said expanders being a unitary member made from an electrically conductive material and having an upper leg and a lower leg, said lower leg being secured in one of said bores of said first neutral bar by one of said wire binding screws and said second leg of said expander being secured in one of said bores of said second neutral bar by one of said wire binding screws.

21. A method of making a neutral bar assembly, said method comprising:

providing a plurality of neutral bars;

each of the neutral bars having a plurality of spaced bores extending through the neutral bar, each of said bores being adapted to receive a wire from behind the neutral bar;

each of the neutral bars having a plurality of spaced, threaded holes, each of said holes extending downwardly from a top surface of said neutral bar into one of said bores;

a plurality of wire binding screws threadably engaged in said holes;

providing a pair of expanders, each of said expanders being a unitary member made from an electrically conductive material and having a body portion and a plurality of legs extending forwardly from said body portion;

inserting said legs of said expanders in said bores of said neutral bars; and rotating said wire binding screws to secure said legs of said expanders in said bores of said neural bars, thereby securing said neutral bars together into said neutral bar assembly.

22. An expander for use in a neutral bar assembly, said neutral bar assembly comprising first and second neutral bars, each of said neutral bars having a plurality of spaced bores extending through the neutral bar, a plurality of spaced, threaded holes, each of said holes extending downwardly from a top surface of said neutral bar into one of said bores and a plurality of wire binding screws threadably engaged in said holes, said expander comprising:

a unitary member made of electrically conductive material having a body portion, an upper leg extending forwardly from said body portion and a lower leg extending forwardly from said body portion, said lower leg being secured in one of said bores of said first neutral bar by one of said wire binding screws and said second leg of said expander being secured in one of said bores of said second neutral bar by one of said wire binding screws.

23. An expander for use in a neutral bar assembly, said neutral bar assembly comprising a plurality of neutral bars, each of said neutral bars having a plurality of spaced bores extending through the neutral bar, a plurality of spaced, threaded holes extending downwardly into said bores of said neutral bar and a plurality of wire binding screws threadably engaged in said holes, said expander comprising:

a unitary member made of electrically conductive material having a body portion and a plurality of legs extending forwardly from said body portion, each of said legs being secured in one of said bores of one of said neutral bars by one of said wire binding screws.

24. A method of making an expander of a uniform width for use in a neutral bar assembly, said method comprising:

providing a bar stock of electrically conductive material;

passing said bar stock through an extruder to create a length of extruded material; and cutting said length of extruded material in a transverse direction to create a plurality of expanders, each of said expanders having a body portion and a plurality of legs extending forwardly from said body portion.

* * * * *